United States Patent [19]
Dresti et al.

[11] Patent Number: 5,363,047
[45] Date of Patent: Nov. 8, 1994

[54] PORTABLE GROUND FAULT DETECTOR

[75] Inventors: Mauro G. Dresti, West Covina; Juan P. Lopetrone, Rancho Palos Verdes; James J. Regan, Covina, all of Calif.

[73] Assignee: Southern California Edison Company, Rosemead, Calif.

[21] Appl. No.: 969,494

[22] Filed: Oct. 30, 1992

[51] Int. Cl.⁵ .......................................... G01R 31/02
[52] U.S. Cl. .................................. 324/510; 324/509; 324/551; 340/650; 361/31
[58] Field of Search ............... 324/509, 510, 511, 529, 324/543, 551; 361/31; 340/650

[56] References Cited

U.S. PATENT DOCUMENTS

| | | | |
|---|---|---|---|
| 3,857,070 | 12/1974 | Smith | 324/509 X |
| 4,368,498 | 1/1983 | Neuhouser | 324/509 X |
| 4,739,274 | 4/1988 | Kimball et al. | 324/529 |
| 4,739,275 | 4/1988 | Kimball et al. | 324/529 |
| 4,837,519 | 6/1989 | Lopetrone et al. | 324/529 |
| 4,929,901 | 5/1990 | Kimball et al. | 324/529 |
| 5,014,043 | 5/1991 | Lopetrone et al. | 324/529 X |

Primary Examiner—Walter E. Snow
Assistant Examiner—Glenn W. Brown
Attorney, Agent, or Firm—Sheldon & Mak

[57] ABSTRACT

Disclosed is a ground fault detection apparatus for an operating, normally ungrounded supply system, the apparatus having a periodically grounded center tap of a test impedance that is connected across conductors of the system, and detector circuitry including a charge balance circuit having low gain and wide dynamic range that measures the amplified voltage output of a Hall effect current sensor. A preferred implementation of the circuit has a charge transfer variable oscillator. A pair of microprocessor-controlled counters that are responsive to the oscillator precisely measure the average frequency of the oscillator over intervals that are automatically maintained at approximately one second in duration, the microprocessor calculating the fault current as the difference between current measurements taken with and without the center tap grounded. The apparatus has sufficient dynamic range for directly measuring system currents on the order of 100 A, while reliably detecting leakage currents in the milliampere range.

20 Claims, 4 Drawing Sheets

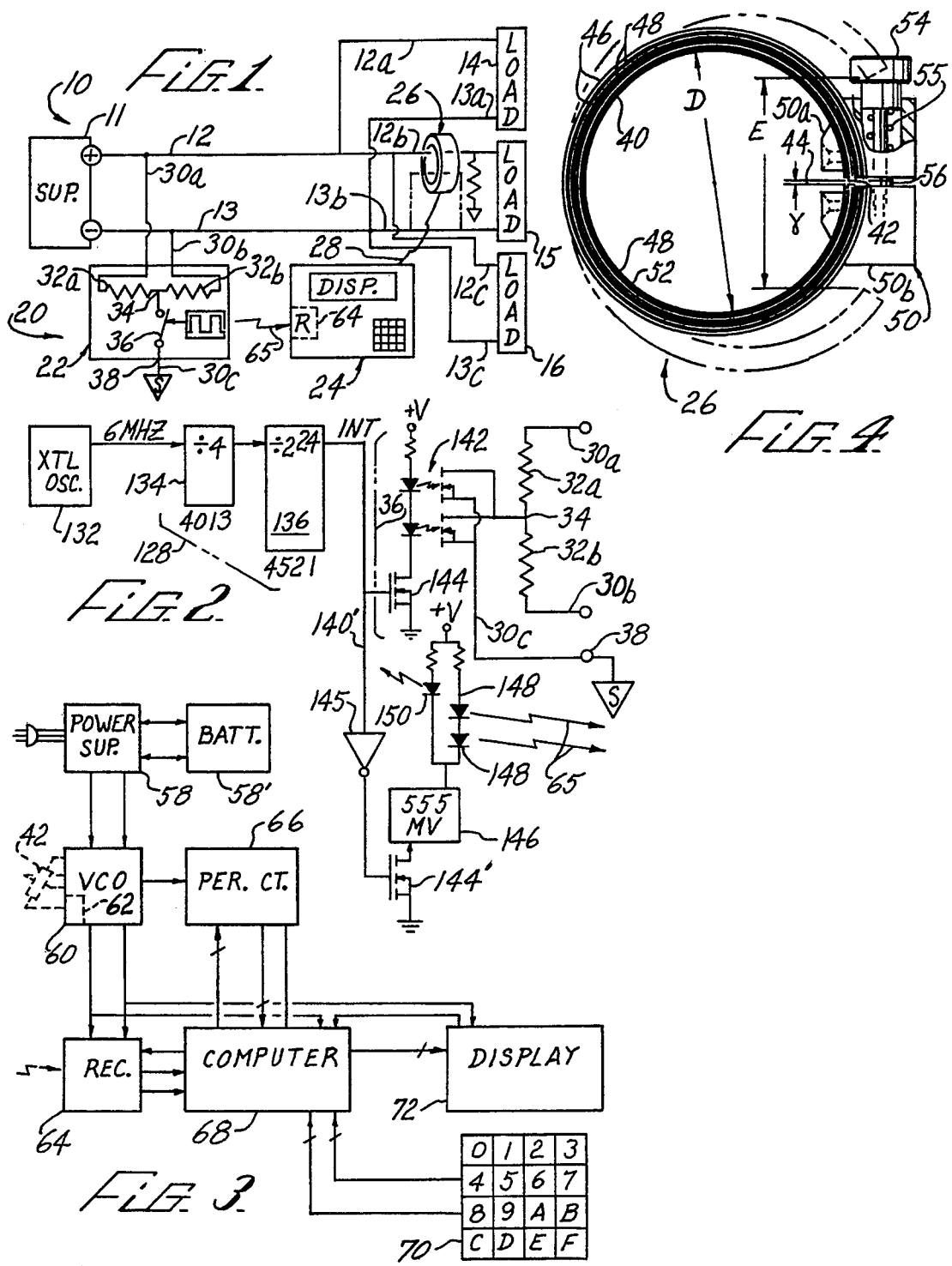

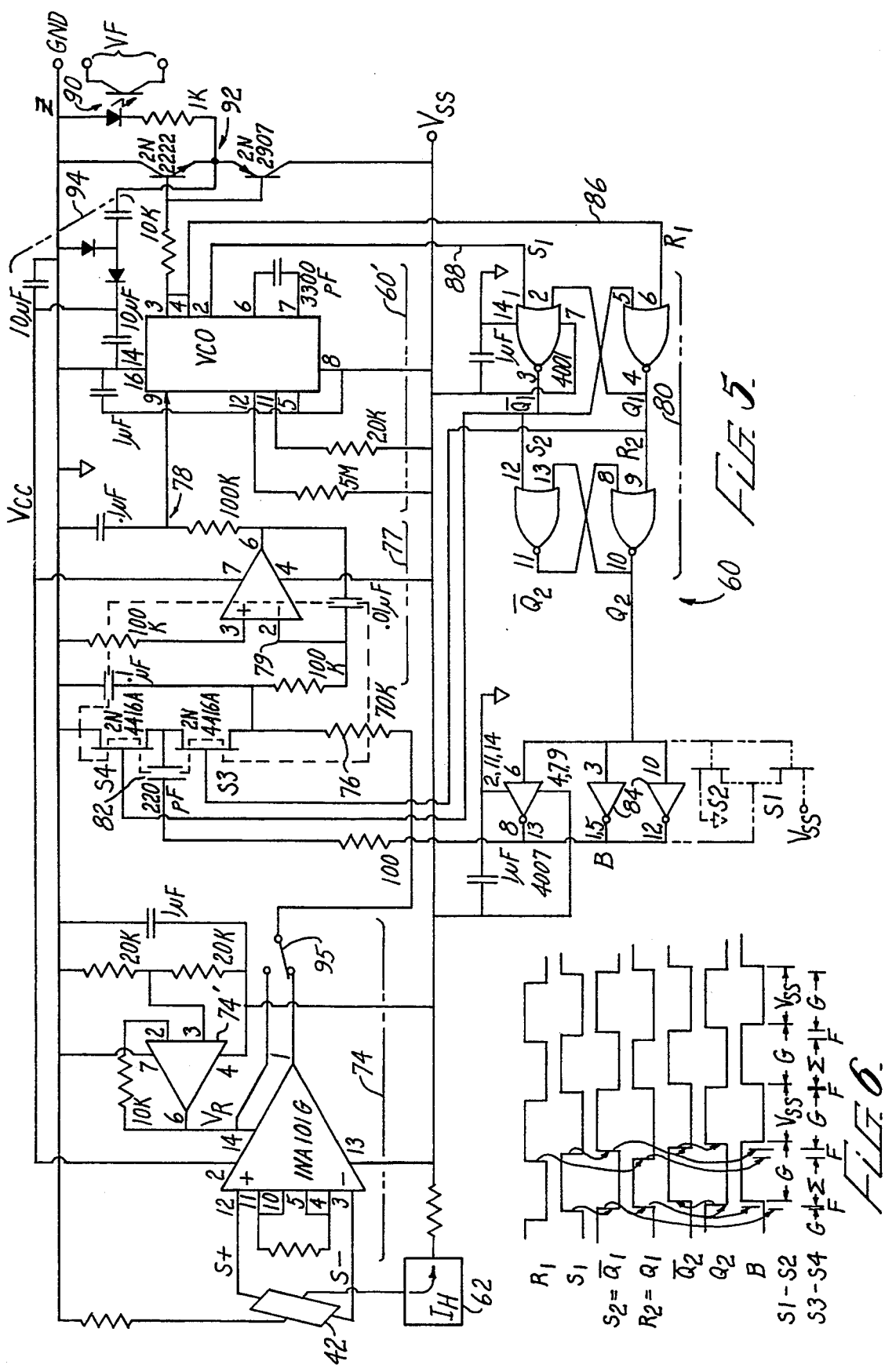

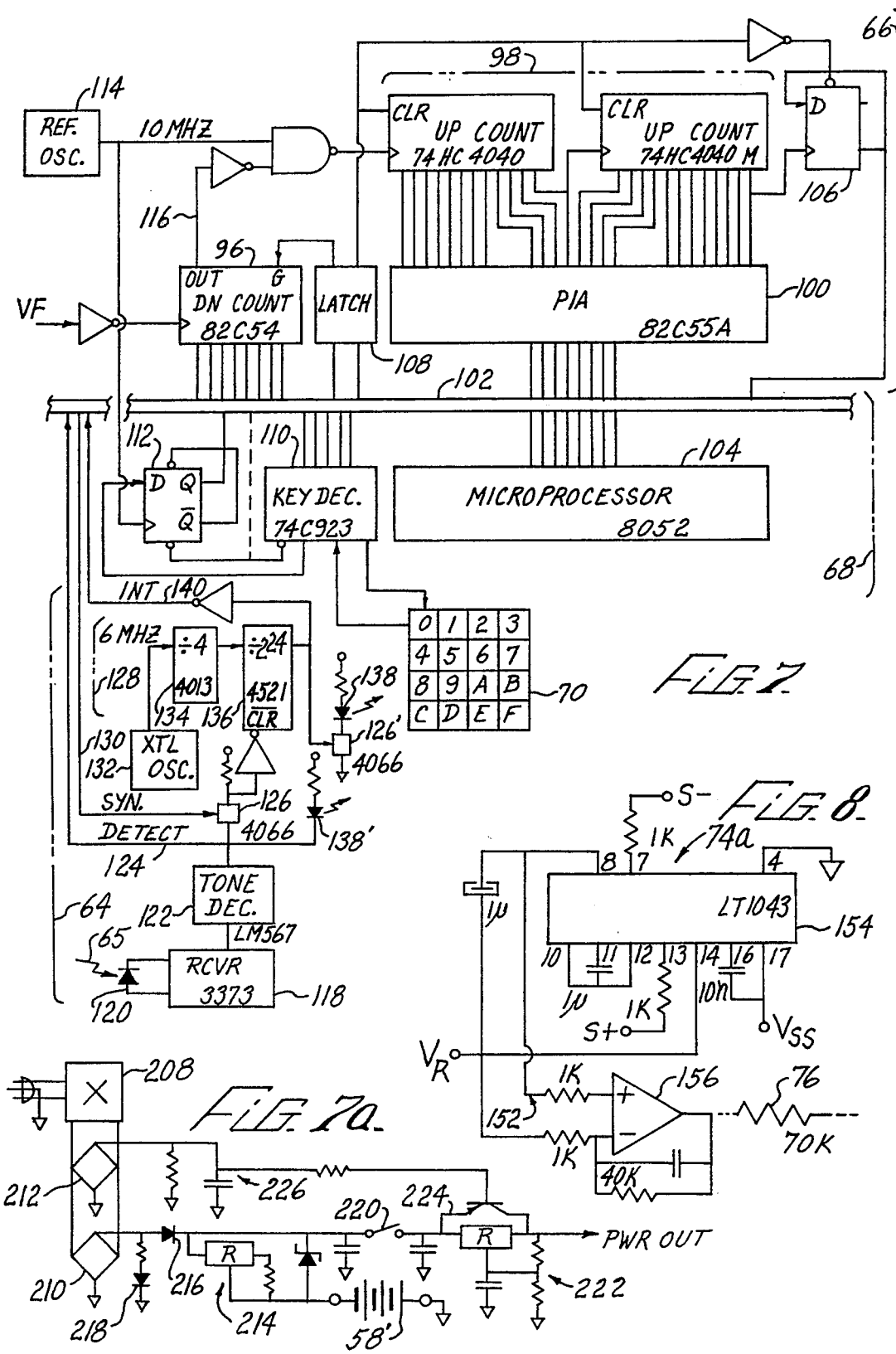

PORTABLE GROUND FAULT DETECTOR

BACKGROUND

The present invention relates to circuit fault detection, and more particularly to ground fault detection and location in normally ungrounded DC power distribution systems. Typically such systems have significant capacitive reactance components and are under the influence of strong electromagnetic fields. These situations are normally associated with utility power generation and distribution, industrial plants, and computer/electronic systems therein. In such systems, ground faults must be located without taking unaffected equipment out of service.

Generating stations and substations use 110 to 240 volt DC ungrounded battery systems to operate control systems and other DC devices. Some of the control systems are critical to plant operational integrity and must operate at all times. If two ground faults on opposite polarities of the same battery system occur simultaneously in the system, the battery may be shorted through ground. If two or more simultaneous ground faults on the same conductor occur, an undesirable bypassing of controlling devices may occur and cause malfunction or misoperation. Consequently isolation and repair of the first fault must, therefore, be performed as quickly and efficiently as possible to minimize the chances that the whole battery system will be shorted or become inoperative.

The major components of an ungrounded DC distribution system usually include the DC battery assembly and battery charger. Main source conductors connect the battery assembly to the circuit breaker of a multifeeder distribution panel, and the individual loads to those feeders. The type of loads associated with this system are motors, solenoids, relays, electronic monitoring equipment, and electronic control devices. A common characteristic associated with this type of system is, firstly, stray capacitance created by the distribution lines with respect to ground and, secondly, input capacitive reactance of the loads. The value of the stray capacitance ranges from a few picofarads to 200 microfarads or more. This is an important characteristic since it plays an important part in the type of test equipment that can be used to locate ground fault currents.

A basic problem in such systems is the need to identify low level DC fault currents, namely, low to high impedance ground fault currents in the presence of much larger DC load currents and electromagnetically induced noise currents.

U.S. Pat. No. 4,837,519 Lopetrone et al., assigned to the assignee of this application and incorporated herein by this reference, discloses ground fault detection using an impedance element connected across a DC power supply, an interrupter periodically connecting a tapping point of the impedance element to ground for producing a fault current signal when a downstream fault condition is present. A magnetic detector that operates synchronously with the interrupter senses the fault current signal when the detector is located between the impedance element and the fault condition. The magnetic detector is connected in a closed-loop, high gain analog circuit, being typically located for enclosing the positive and negative conductors of the system whereby the gross load current is cancelled. The circuit can then measure the fault current and provide indication of the fault. The '519 patent also discloses a control current device feeding an offset coil winding of the magnetic detector for adjustably biasing the detector against the effects of the gross load current, whereby the detector, which may be a portable unit, can be applied to only one of the positive and negative conductors.

The above-disclosed system as operationally implemented has an analog gain in excess of 1,000,000, being interfaced through an 8-bit analog to digital converter, the detector circuitry having sufficient dynamic range for directly measuring fault currents only when the load current is cancelled (the sensor enclosing positive and negative system conductors) or when the load current is balanced by the adjustable bias control current. This limited dynamic range reflects the relatively large load currents that can approach 100 amps which can be present, and the need to accurately measure fault currents as low as ±3 milliamperes. Thus the load current must be balanced to within approximately ±1 ampere for the system to work properly, a relatively difficult task when one line only is being sensed. The closed-loop, high gain circuitry is difficult to stabilize and calibrate, especially on account of phase shifts and heating associated with the offset coil winding.

The above-disclosed system, while providing useful ground fault detection and location in typical environments, still exhibits one or more of the following disadvantages:

1. It is expensive to produce and maintain in that the construction of the detector is complicated by the required coil for the control current, and because a high degree of skill is needed for setting up the high-gain closed-loop circuitry;
2. It is difficult to use and/or ineffective in many situations wherein only one of the system conductors is available for sensing; and
3. The sensitivity is marginal in some applications.

It is also known to utilize a charge transfer voltage controlled oscillator for measuring an unknown capacitance. It is believed that such techniques have not been extended by others to the problem of ground fault detection in DC power systems.

Thus there is a need for a portable ground fault detector that avoids the disadvantages of the prior art.

SUMMARY

The present invention meets this need by providing an apparatus for detecting a ground fault condition in a normally ungrounded supply system including conductors from a supply for supplying power to a load connected in the system. In one aspect of the invention, the apparatus includes divider means for connecting a test impedance across the power supply, the test impedance having a tapping point; grounding means for periodically connecting the tapping point to ground potential; a current transducer for measurement of electrical current in one or more of the conductors at a location downstream of the divider means during operation of the system; a detector circuit for signalling the ground fault condition, including gain means for producing a first voltage signal proportional to the electrical current measured by the current transducer over a range of the current in excess of 10 A; integrator means for producing an integrator signal and having a summing input that is maintained proximate a first reference voltage; oscillator means for producing a variable frequency oscillator output smoothly proportional to an average DC component of the integrator signal; a reference resistor connected between the gain means and the summing input for converting the first voltage signal to a current feeding the integrator means; a reference capacitor; and switch control means responsive to the oscillator for sequencing the reference capacitor among a first connection wherein opposite sides of the capacitor are connected between the first reference voltage and a second reference voltage, a second connection between the summing input and the second reference voltage, a third connection between the summing input and the first reference voltage, and a fourth connection of both sides to the same potential, the frequency of the oscillator being a repeatable function of the net current sensed by the current transducer.

The detector circuit can further include counter means for periodically accumulating counts from the oscillator means, and signal means responsive to the counter means for indicating the fault condition. Preferably the detector circuit is remotely locatable from the grounding means, the detector circuit having means for synchronizing the counter means with the grounding means. Thus the current transducer can be conveniently positioned for locating the actual site of the fault.

The means for synchronizing preferably includes transmitter means connected to the grounding means for radiating a periodic transmitter output, and receiver means connected to the detector circuit for activating the counter means in response to the transmitter output.

The counter means can include a first counter that is set for counting a predetermined number of oscillator intervals, and a gated second counter for determining a period of time during which the first counter is active. The second counter can count at a fixed reference frequency. The apparatus can further include means for maintaining the period of time at approximately 1 second, the reference frequency being in excess of 1 MHz. The reference frequency can be from approximately 6 MHz to approximately 10 MHz. Preferably the reference frequency is approximately 10 MHz. The predetermined number of oscillator intervals to be set in the first counter before a counting period can be periodically adjusted proportional to a reciprocal of the period of time determined by the second counter in a previous counting period. The signal means can include a programmed microprocessor for controlling the counter means, and display means operatively responsive to the microprocessor. The gain means can include a charge-coupled level-shifting amplifier for enhanced noise immunity.

In another aspect of the invention, the apparatus includes the divider means; the grounding means; a current transducer for measurement of electrical current in one or more of the conductors at a location downstream of the divider means during operation of the system and being capable of directly sensing a net current over a current range not less than 10 A; a detector circuit having a charge balance circuit for signalling the ground fault condition and further including means for producing a first current signal that is direct function of the net current measured by the current transducer when the grounding means is inactive; means for producing a second current signal that is a direct function of the net current measured by the current transducer when the grounding means is active; and means for producing a third current signal that is the difference between the first and second current signals and being indicative of the ground fault condition at a ground fault current of less than 10 mA at any net current within the current range. Preferably the load current range extends from approximately zero to approximately 100 A, the means for producing the third current signal being operative when the ground fault current is only approximately 3 mA.

In a further aspect of the invention, the apparatus includes the divider means, the grounding means, the current transducer, a detector circuit having means for producing digital counterparts of the net current signal, including the first, second and third current signals. The means for producing digital counterparts of the net current signal can include a charge-balance circuit. The charge-balance circuit can include an integrating amplifier.

DRAWINGS

These and other features, aspects, and advantages of the present invention will become better understood with reference to the following description, appended claims, and accompanying drawings, where:

FIG. 1 is a pictorial schematic diagram of a normally ungrounded DC power distribution system having applied thereto a ground fault detector according to the present invention;

FIG. 2 is a simplified circuit schematic of an interrupter portion of the detector of FIG. 1;

FIG. 3 is a block diagram of an instrument portion of the detector of FIG. 1;

FIG. 4 is a fragmentary sectional end view of a current sensor assembly of the detector of FIG. 1;

FIG. 5 is a simplified circuit schematic of a voltage controlled oscillator (VCO) portion of the detector of FIG. 1, the VCO portion incorporating a Hall effect transducer (HET) of the sensor assembly of FIG. 4;

FIG. 6 is a timing diagram of a switch control function of the VCO of FIG. 5;

FIG. 7 is a simplified circuit schematic of a microprocessor controlled period counter portion of the detector of FIG. 1;

FIG. 7a is a simplified schmatic showing circuit details of a power supply portion of the instrument portion of FIG. 3;

FIG. 8 is a simplified schematic showing an alternative configuration of a gain portion of the circuit of FIG. 5.

DESCRIPTION

Figure 9:
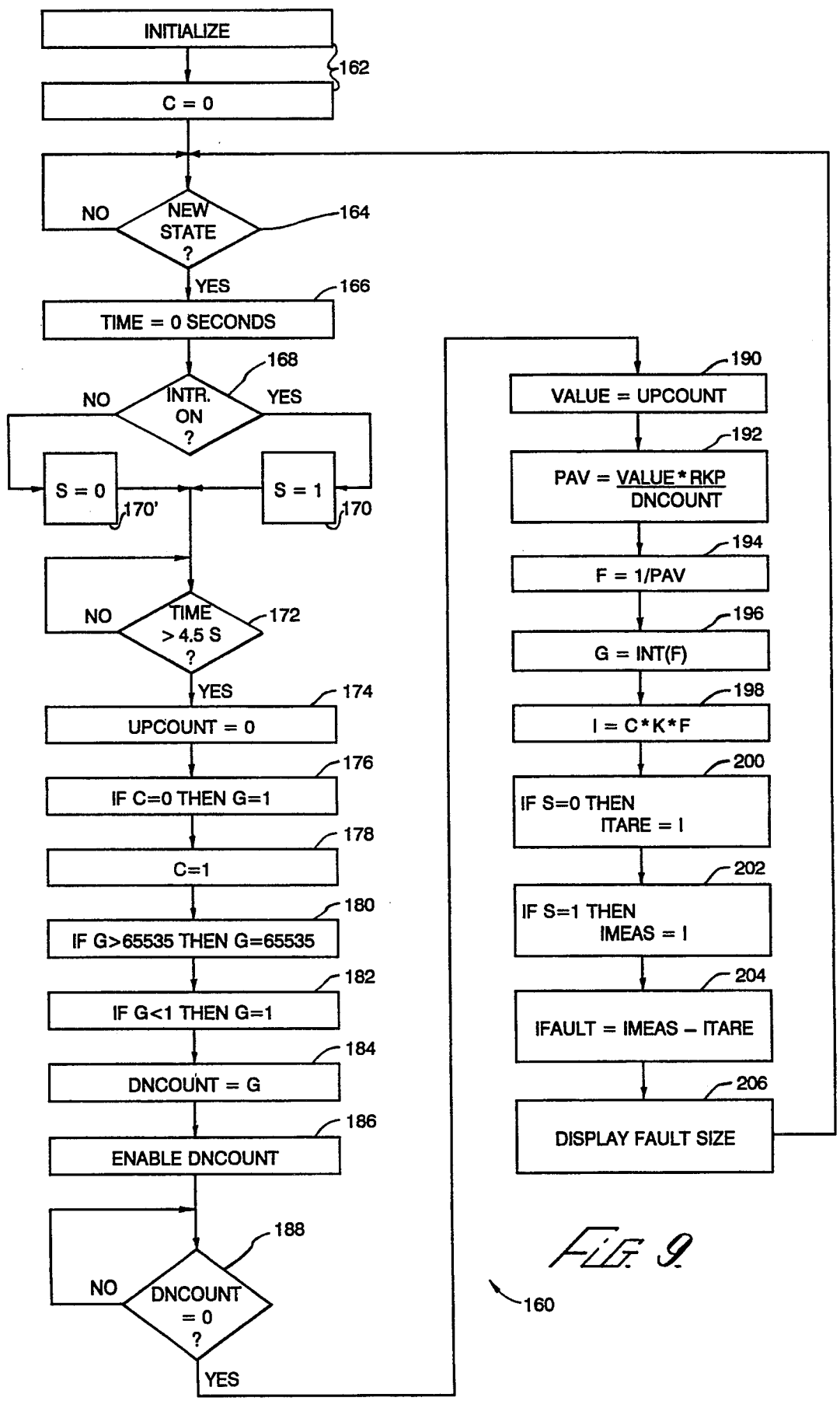
FIG. 9 is a flow chart showing programmed operation of the instrument portion of the detector of FIG. 1.

The present invention is directed to a portable ground fault detector that is particularly versatile and effective for detecting and locating ground faults in normally ungrounded DC power distribution systems. With reference to FIGS. 1-9 of the drawings, a DC power distribution system 10 includes a battery or other power source 11, a positive main bus bar 12 and a negative main bus bar 13 supplying power to one or more loads designated 14, 15, and 16 in the exemplary embodiment shown in FIG. 1. The bus bars 12 and 13 are branched, forming respective positive conductors 12a, 12b, and 12c and negative conductors 13a, 13b, and 13c feeding the loads 14, 15, and 16, respectively.

A ground fault detector apparatus 20 according to the present invention includes an interrupter unit 22 and an instrument unit 24, a magnetic sensor assembly 26 being connected to the instrument unit 24 by a sensor cable 28. The interrupter unit 22 is connected by appropriate leads 30a and 30b to the respective bus bars 12 and 13, the leads 30a and 30b being connected within the interrupter unit 22 to a series pair of interrupter resistors, respectively designated 32a and 32b, a center tap 34 that is formed between the resistors 32 being connected through a function switch 36 to a system grounding point 38 of the interrupter unit 22, the grounding point 38 being connected by a ground lead 30c to an appropriate system ground. The function switch 36 periodically grounds the center tap 32 as described in the above-referenced U.S. Pat. No. 4,833,519. Other features of the interrupter Unit 22 are described below.

With particular reference to FIG. 4, the magnetic sensor assembly 26 includes a magnetic main ring 40, the ring 40 being clampable about one or more conductors, a magnetically sensitive transducer or sensor 42 bridging a gap 44 at one side of the assembly 26, the gap 44 having a gap width $\gamma$. The main ring 40, being formed of a highly permeable material, functions as a magnetic flux concentrator for enhancing the sensitivity of the sensor 42 to current flowing in the conductors.

The sensor assembly 26 includes an outside ring 46, also formed of a highly permeable material for shielding external electromagnetic interference, the rings 40 and 46 being separated by an insulation layer 48. In the exemplary configuration of FIG. 4, there are respective coaxial pairs of the outside ring 46 and the insulation layer 48. Opposite ends of the rings 40 and 46 are connected to separable portions of a clamp assembly 50, the portions being designated 50a and 50b. The sensor assembly 26 has an inside diameter D through which conductors are placed for use of the apparatus 10, the portions 50a and 50b being separable to a distance E for receiving one or both of the bus bars 12 and 13 without interrupting service. In configurations of the sensor assembly 26 wherein the inside diameter D is 3 inches or more, a highly magnetically permeable inside ring 52 and an intervening counterpart of the insulation layer 48 are laminated to the main ring 40 for further attenuation of electromagnetic imbalances.

The sensor 42 is preferably a Hall Effect Transducer (HET) that is fed a constant excitation current by suitable means within the instrument unit 24, the sensor 42 producing a sensor voltage $V_H$ that is proportional to $\Sigma I_n$, wherein $I_n$ represents a current flowing in the nth conductor passing through the sensor assembly 26. According to the present invention, $V_H$ is highly linear within a range exceeding $\pm 60$ mV, corresponding to a current range of approximately $\pm 90$ A, a 1 mA current change producing a change of only about 60 mV*1 mA/90 A=0.67 $\mu$V in $V_H$, such small changes being detectable by circuitry within the instrument unit 24 as described below.

A suitable HET device for the sensor 42 is commercially available as Model HR70 Hall effect device from Ohio Semitronics, of Columbus, Ohio. The rings 40, 46 and 52 can be formed of magnetic lamination, in sheets having a thickness of approximately 0.125 inch, in appropriate circumferential lengths and having widths of approximately 1 inch to approximately 2 inches. Similarly, the insulation layers 48 can be formed of polypropelene, approximately 0.030 inch in thickness. As shown in FIG. 4, the clamp assembly 50 is secured by a threaded fastener 54 that compressively loads a clamp spring 55 for easily applying a repeatable clamping force, the clamp assembly also having a pair of spacers 56 that project across the gap 44 for limiting the proximity of the clamp components 50a and 50b, thereby repeatably maintaining the gap width $\gamma$ at a desired width which can be from approximately 0.008 inch to approximately 0.030 inch.

With particular reference to FIG. 3, the instrument unit 24 is microprocessor controlled, being provided with a suitable power supply 58 and associated rechargeable battery 58'. The power supply 58, having circuitry for charging the battery 58' from conventional AC mains and a DC voltage regulator that is also powered from the AC mains, has a power saving circuit that bypasses the voltage regulator when battery power is being used. Further details of the power supply 58 are described below in connection with FIG. 7a. The instrument unit 24 includes a voltage controlled oscillator (VCO) section 60 that is responsive to the sensor assembly 26 and having a constant current source 62 for excitation of the sensor 42. The instrument unit 24 also includes a receiver 64 for synchronizing operation of the instrument unit 24 with an infra-red transmitter output 65 of the interrupter unit 22, and a period counter 66 for measuring the reciprocal of the frequency of the VCO section 60. A computer 68 is interfaced to the period counter 66 for control and interrogation thereof, and to a keyboard 70 and a digital display 72 for interaction with an operator of the apparatus 10.

As shown in FIG. 5, the sensor 42 feeds a gain element 74 of the VCO section 60, the gain element 74 being coupled to a VCO circuit 60' through a reference resistor 76, an integrator 77, and a low-pass filter 78. A switch control circuit 80 that is driven by the VCO circuit 60' periodically charges and discharges a reference capacitor 82 as described herein, the VCO section 60 functioning as a charge transfer oscillator. The discharging current of the capacitor 82, along with current through the resistor 76, feeds an input 79 of the integrator 77, the frequency of the VCO circuit 60' automatically adjusting for balancing the discharging of the capacitor 82 against the current traversing the reference resistor 76. In particular, one side of the capacitor 82 is connected between first and second switches S1 and S2, the opposite side of the capacitor 82 being connected between third and fourth switches S3 and S4, the switches S2 and S4 being connected to a ground reference voltage Z, each of the switches S1-S4 being controlled by the switch control 80. The first switch S1 is connected to a (negative) reference voltage $V_{ss}$ that is also utilized by the gain element 74, the third switch S3 being connected to the input 79 of the integrator 78. The switches S1 and S2 are physically present as complementary portions of parallel-connected CMOS inverters 84, being shown functionally by the dashed lines in FIG. 5. The switch control 80 includes a cascaded pair of RS flip-flop circuits that are formed by a conventional QUAD CMOS integrated circuit, the switch control 80 being separately responsive to a direct output 86 and an inverted (and slightly delayed) output 88 of the VCO 60 for insuring that the switches S1-S4 are sequenced symmetrically and without harmful short circuits occurring.

As further shown in FIG. 6, the switch control 80 is responsive to the direct output 86 (R1) and the inverted output (S1) of the VCO circuit 60' for producing an output $Q_2$ that drives the switches S1 and S2 to produce a waveform B at one side of the capacitor 82. The switch control 80 also has outputs $Q_1$ and $/Q_1$ respectively driving the switches S3 and S4 for sequentially connecting the other side of the capacitor 82 to ground (Z), a floating potential (F), and the input 79 ($\Sigma$) of the integrator 77, the intervals of floating potential F being interspersed between the other intervals for avoiding the undesired short circuits.

The VCO circuit 60' also drives a level shifting opto-isolator 90 through a bipolar emitter-follower circuit 92 that produces a buffered VCO output VF for feeding the period counter 66 as described below, the circuit 92 also feeding a level-shifting rectifier circuit 94 that generates a positive supply voltage $V_{CC}$ for biasing the gain element 74 and the integrator 77. As further shown in FIG. 5, the gain element 74 has an associated operational amplifier 74' for maintaining a reference voltage $V_R$ that is used by the gain element 74, the voltage $V_R$ being approximately half-way between the ground reference Z and the negative reference $V_{SS}$.

Operation of the VCO section 60 is better understood with reference to the following equations of charge:

$$\text{(charge)} \quad Q = C^*E \quad (1)$$

$$\text{(discharge)} \quad Q = \int_0^t I^*dt \quad (2)$$

$$\text{(discharge)} \quad Q = \int_0^t \frac{V}{R} *dt \quad (3)$$

Where:
Q=Electrical charge (coulombs)
C=Capacitance of reference capacitor
E=Applied potential of reference voltage
I=Discharge current In Equation (3), V/R has been substituted for I, where V is the voltage output of the HET 42 times the gain of the gain element 74 and R is the resistance of the reference resistor 76.

When the switches S1 and S4 are on and the switches S2 and S3 are off, the reference capacitor 82 is charged between the reference voltage $V_{ss}$ and the ground potential Z. The switches S3 and S4 are then toggled so as to switch the reference capacitor 82 from the ground potential Z to the input 79 (Σ) which is maintained at virtual ground potential by the integrator 77. These switches S1 and S2 are next toggled so as to switch the reference capacitor 82 from the reference voltage to ground, thereby discharging the capacitor 82 into the input 79 of the integrator 77. When all of the charge is removed from the reference capacitor 82, the switches S3 and S4 are toggled to their original state, thereby reconnecting that side of the capacitor 82 to ground Z. The final step of the sequence sets the switches S1 and S2 to their original state, thus setting up the VCO section 60 so that the process can repeat indefinitely. During the time when the capacitor 82 is charging (Equation (1)), the reference resistor 76 transfers charge from the gain element 74 to the 79 input of the integrator 77 as accurately expressed by Equation (3). The integrator 77, the VCO circuit 60', and the switch control circuit 80 adjust the rate of switching such that charge through the reference resistor 76 matches the charge delivered from the reference capacitor 82 into the integrator 77. A closed loop is formed by the integrator 77, the VCO circuit 60' switching the switch control circuit 80, the switches S1-S4 and the reference resistor 76 and capacitor 82. The stability of the VCO section 60 for measuring the voltage output of the HET 42 is excellent because it is dependent only upon the stability of the reference resistor 76 and capacitor 82. Accordingly, a suitable resistor for use as the reference resistor 76 is available as Vishay S102 low $T_C$ resistor, available from Vishay Electronic Components, of Malvern, Pa.

As further shown in FIG. 5, a test switch 95 is provided for switching the reference resistor 76 from the gain element 74 to the reference voltage $V_R$ for open-loop operation of the VCO section 60 without control by the sensor 42.

With particular reference to FIG. 7, the period counter 66 includes a 16 bit presettable gated down-counter 96, and a 24 bit resettable up-counter 98, the counter 98 being connected to respective ports of a peripheral interface adaptor (PIA) 100, the PIA 100 and the down-counter 96 being connected to a bus 102 of the computer 68. The computer 68 includes a microprocessor 104 and conventional memory and address decoding circuitry (not shown). It will be understood that FIG. 7 is a simplified functional schematic, appropriate power supply connections and chip select (address decoding) details being known by those skilled in the art. An overflow latch 106 is responsive to a most significant output M of the up-counter 98 for signalling an overflow condition of the period counter 66 to the bus 102 for appropriate programmed response by the computer 68.

A mode latch 108 is also interfaced to the bus 102 for selectively enabling the down-counter 96 and for selectively clearing the up-counter 98 and the overflow latch 106 under program control by the microprocessor 104.

The keyboard 70 is interfaced to the bus 102 of the computer 68 through a key decoder 110, the key decoder 110 having an associated keyboard latch 112 for signalling the availability of keyboard data to the computer 68, also via the bus 102. The keyboard latch 112 and the up-counter 98 are clocked at 10 MHz by a reference oscillator 114, the clocking of the up-counter 98 being gated with an output signal 116 of the down-counter 96.

After the down-counter 96 is enabled under program control via the mode latch 108, the output signal 116 is activated (low) in response to the first negative transition of the VCO output VF, the 10 MHz output of the reference oscillator 114 then passing to the up-counter 98. The output signal 116 remains active until the down-counter 96 reaches zero, then being inactivated so that the up-counter 98 stops, the computer 68 then reading the accumulated count of the up-counter 98 by appropriate activation of the PIA 100.

Details of the receiver 64 are also shown in FIG. 7. In particular, the receiver 64 includes a receiver circuit 118 that is responsive to an infra-red photodiode 120 for receiving the transmitter output 65 from the interrupter unit 22, the receiver circuit 118 driving a tone decoder 122 for producing a detect signal 124 when the photodiode 120 is activated at a predetermined frequency by the interrupter unit 22 as described below. The detect signal 124 is connected to the bus 102 for signalling the computer 68. The detect signal 124 is also connected to one side of a bidirectional switch 126 for selective activation of a multi-bit divider circuit 128 in response to a synchro signal 130 from the computer 68, the synchro signal 130 also being interfaced through the bus 102. The divider circuit 128 is clocked by a crystal oscillator 132 at 6 MHz, the divider circuit 128 having a divide-by-four element 134 that is cascaded with a 24-bit counter circuit 136. The output of the divider circuit 128 controls an interrupter annunciator indicator 138 (LED) by means of a counterpart of the bidirectional switch, designated 126'. Another LED, designated detect indicator 138', being driven directly by the detect signal 124, visually signals reception of the infra-red transmitter output 65 from the interrupter unit 22. An inverted counterpart of the output of the divider circuit 123 provides an interrupter output 140 for signalling the computer 68 at approximately 6-second intervals, the interrupter output 140 also being interfaced through the bus 102. Accordingly, the interrupter output 140 corresponds to operation of the function switch 36 of the interrupter unit 22, as further described below.

With particular reference to FIG. 2, the interrupter unit 22 has counterparts of the divider circuit 128 and the 6 MHz crystal oscillator 132 of the receiver 64 that forms a portion of the instrument unit 24. The divider circuit 128 also includes counterparts of the divide-by-four element 134 and the counter circuit 136, a counterpart of the interrupter output 140, designated interrupter signal 140', being generated at the same approximate 6 second intervals (12 second period).

The interrupter signal 140' drives the function switch 36 for periodically grounding the center tap 34 as described above, the function switch 36 being implemented by an opto-isolator 142 having parallel-connected outputs and series-connected inputs, the inputs being switched by an inverting field-effect transistor (FET) 144. The interrupter signal 140' also drives another FET, designated 144', through an inverter buffer 145 for activating an astable multivibrator 146 when the opto-isolator 142 is inactive, the multivibrator 146 powering a series-connected pair of infra-red light emitting diodes (LEDs) 148, the LEDs 148 producing the transmitter output 65, described above. The multivibrator 146 also powers a visible LED 150 for indicating the periodic activation of the transmitter output 65.

With further reference to FIG. 8, an alternative configuration of the gain element 74, designated 74a, provides a precision charge-coupled amplifier 152. The amplifier 152 includes a monolithic, charge-balanced, dual switched-capacitor instrumentation building block 154 having differential inputs connected to the HET 42. The connections from the HET 42 at the building block 154 include conventional diode clamps (not shown) between the voltage $V_{ss}$ and ground. The building block 154 drives an operational amplifier 156, the amplifier 156 feeding the reference resistor 76. The amplifier 152 provides charge-coupled, level shifting amplification with very high noise immunity and common mode power supply rejection. A device suitable for use as the building block 154 is an LTC1043 building block, available from Linear Technology Corporation of Milpitas, Calif. The operational amplifier 156 can be an LTC1051 amplifier, also available from Linear Technology Corporation.

With further reference to FIG. 9, a main program sequence 160 of the computer 68 periodically determines and displays the presence and character of ground fault conditions in the system 10 as described herein. Following an initialize step 162 wherein a count flag C and appropriate registers of the computer 68 are set up, including the count flag C that is reset, in a conventional manner. The state of the interrupter output 140 is compared with a previously stored counterpart of the output 140 for determining whether the output 140 has changed states in a state test step 164. If not, the state test step 164 is repeated, the program sequence 160 waiting for the output 140 to change. When the change of state is detected, an incrementing clock variable TIME is reset in a clock reset step 166. Next, an interrupter test step 168 is performed for determining whether the interrupter output 140 is active. If so, a state flag S is set in a flag set step 170; otherwise, the state flag S is reset in a complement of the flag set step, designated 170'. Next, TIME is compared with the equivalent of 4.5 seconds in a start test step 172. If not greater, the start test step 172 is repeated; otherwise, the program sequence 160 proceeds, the 4.5 second interval assuring that the system 10 has achieved steady state conditions prior to measurement.

At this time, the up-counter 98 is reset in a count reset step 174. A downcount setting G is set to 1 if the count flag C remains reset in a first G set step 176, the count flag C being subsequently set in a count set step 178. In a second G set step 180, if the down-count setting G is greater than 65535, then the down-count setting is set to 65535. In a third G set step 182, if the downcount setting G is less than 1, the down-count setting G is equal to 1. At this point, the downcount setting G is forced to be within a permissible range (1 to 65535). During normal operation of the system 10 when the count flag C is set, the setting G varies within this range, and the steps 176, 178, 180, and 182 do not affect the value of the downcount setting G.

The downcount setting G is now loaded into the down-counter 96 in a count set step 184 and the down-counter 96 is then enabled in a count enable step 186. The program sequence 160 next proceeds to an empty test step 188 wherein the content of the down-counter 96 is sampled and compared with zero, the step 188 being repeated until the down-counter 96 reaches zero, the content of the up-counter 98 at that time being saved as a variable VALUE in a read step 190. The average period of the VCO output VF is next determined in a period step 192 wherein a variable PAV is set to VALUE*RKP/G where RKP is the period of reference oscillator 114. The reciprocal of PAV is stored as an average frequency of the VCO output VF (FAV) in a frequency step 194, and a new value of the downcount setting G is stored as the integer portion of FAV in variable G set step. By setting the downcount setting G as the integer portion of FAV, a time base interval during which the down-counter 96 decrements is made to be approximately one second. The program sequence 160 next computes a sensed current value I equal to CF*KF*FAV in a current step 198, where CF is a conversion factor (mA/HZ), and KF is a calibration factor (dimensionless). Next, the computed current value I is saved as ITARE if the state flag S is reset in a tare save step 200; otherwise, (the state flag S being set) the current value I is saved as IMEAS in a measure step 202. Finally, a measured fault current IFAULT is computed and saved as IMEAS-ITARE in a fault save step 204, the value IFAULT being transmitted to the display 72 in a fault display step 206, the program sequence 160 looping to again enter the state test step 164.

With reference to FIG. 7a, the power supply 58 has a conventional transformer 208 that powers a pair of bridge rectifiers 210 and 212, the bridge rectifier 210 feeding a current regulator 214 through a blocking diode 216, the current regulator 214 charging the battery 58'. The bridge rectifier 210 also powers an LED indicator 218 for displaying the presence of AC power into the transformer 208. The blocking diode 216 also feeds, through a power switch 220, a main regulator 222 for powering other circuitry of the instrument unit 24. According to the present invention, a shunt transistor 224 bypasses the main regulator 222 when the AC power is not present, the shunt transistor 224 being fed from the bridge rectifier 212, a conventional R-C filter circuit 226 being connected across the bridge rectifier 212 for smoothing the output of the rectifier 212.

Although the present invention has been described in considerable detail with reference to certain preferred versions thereof, other versions are possible. For example, other high resolution, low gain front end charge balance circuits that can be used in the present invention include a dual-slope integrator and a "sigma-delta" analog to digital converter of the type commercially used in compact disk players and having an integrator, a comparator, and a low-pass filter. An operative but less preferred implementation has a digital to analog converter, and a comparator that is responsive to the converter output and the output of the gain means for changing the digital input to the converter. Therefore, the spirit and scope of the appended claims should not necessarily be limited to the description of the preferred versions contained herein.

What is claimed is:

1. Apparatus for detecting a ground fault condition in a normally ungrounded supply system including conductors from a supply for supplying power to a load connected in the system, the apparatus comprising:
   (a) divider means for connecting a test impedance across the power supply, the test impedance having a tapping point;
   (b) grounding means for periodically connecting the tapping point to ground potential;
   (c) a current transducer for measurement of electrical current in one or more of the conductors at a location downstream of the divider means during operation of the system; and
   (d) a detector circuit for signalling the ground fault condition, comprising:
      (i) a gain circuit for producing a first voltage signal, the first voltage signal being proportional to the electrical current measured by the current transducer over a range of the current in excess of 10 A;
      (ii) an integrator for producing an integrator signal, the integrator having a summing input that is maintained proximate a first reference voltage;
      (iii) an oscillator for producing a variable frequency oscillator output, the frequency of the oscillator output being smoothly proportional to an average DC component of the integrator signal;
      (iv) a reference resistor connected between the gain circuit and the summing input for converting the first voltage signal to a current feeding the integrator;
      (v) a reference capacitor; and
      (vi) a switch controller responsive to the oscillator for sequencing the reference capacitor among a first connection wherein opposite sides of the capacitor are connected between the first reference voltage and a second reference voltage, a second connection between the summing input and the second reference voltage, a third connection between the summing input and the first reference voltage, and a fourth connection of both sides to the same potential, the frequency of the oscillator being a repeatable function of the net current sensed by the current transducer.

2. The apparatus of claim 1, wherein the detector circuit further comprises a counter circuit for periodically accumulating counts from the oscillator, and a signal circuit responsive to the counter circuit for indicating the fault condition.

3. The apparatus of claim 2, wherein the detector circuit is remotely locatable from the grounding means without physical connection thereto, the detector circuit having a synchronizer for periodically synchronizing the counter circuit with the grounding means.

4. The apparatus of claim 3, wherein the synchronizer comprises a transmitter connected to the grounding means for radiating a periodic transmitter output, and a receiver connected to the detector circuit for activating the counter circuit in response to the transmitter output.

5. The apparatus of claim 2, wherein the counter circuit comprises:
   (a) a first counter for counting a predetermined number of intervals of the oscillator means; and
   (b) a gated second counter for determining a period of time during which the first counter counts the intervals.

6. The apparatus of claim 5, wherein the second counter counts at a fixed reference frequency.

7. The apparatus of claim 6, comprising means for maintaining the period of time at approximately 1 second, the reference frequency being in excess of 1 MHz.

8. The apparatus of claim 7, wherein the reference frequency is from approximately 6 MHz to approximately 10 MHz.

9. The apparatus of claim 7, wherein the reference frequency is approximately 10 MHz.

10. The apparatus of claim 7, wherein the predetermined number of intervals to be counted by the first counter in a counting period is periodically adjusted proportional to a reciprocal of the period of time determined by the second counter in a previous counting period.

11. The apparatus of claim 2, wherein the signal circuit comprises a programmed microprocessor for controlling the counter circuit, and display means operatively responsive to the microprocessor.

12. The apparatus of claim 1, wherein the gain circuit comprises a charge-coupled level-shifting amplifier for enhanced noise immunity.

13. Apparatus for detecting a ground fault condition in a normally ungrounded supply system including conductors from a supply for supplying power to a load connected in the system, the apparatus comprising:
   (a) divider means for connecting a test impedance across the power supply, the test impedance having a tapping point;
   (b) grounding means for periodically connecting the tapping point to ground potential;
   (c) a current transducer for measurement of electrical current in one or more of the conductors at a location downstream of the divider means during operation of the system, the current transducer being capable of directly sensing a net current over a current range not less than 10 A; and
   (d) a detector circuit having a charge balance circuit for signalling the ground fault condition, the detector circuit further comprising:
      (i) means for producing a first current signal, the first current signal being a direct function of the net current measured by the current transducer when the grounding means is inactive;

(ii) means for producing a second current signal, the second current signal being a direct function of the net current measured by the current transducer when the grounding means is active; and (iii) means for producing a third current signal, the third current signal being the difference between the first and second current signals and being indicative of the ground fault condition at a ground fault current of less than 10 mA at any net current within the current range.

14. The apparatus of claim 13, wherein the current range is from approximately 0 A to approximately 100 A, the detector circuit being operative in response to the third current signal when the ground fault current is only approximately 3 mA.

15. The apparatus of claim 14, wherein the charge balance circuit comprises a charge balance oscillator.

16. The apparatus of claim 15, wherein the first and second current signals are proportional to a variable frequency output of the charge balance oscillator.

17. Apparatus for detecting a ground fault condition in a normally ungrounded supply system including conductors from a supply for supplying power to a load connected in the system, the apparatus comprising:
 (a) divider means for connecting a test impedance across the power supply, the test impedance having a tapping point;
 (b) grounding means for periodically connecting the tapping point to ground potential;
 (c) a current transducer for measurement of electrical current in one or more of the conductors at a location downstream of the divider means during operation of the system, the current transducer being capable of directly sensing a net current over a current range of from approximately 0 A to approximately 100 A; and
 (d) a detector circuit having means for producing digital counterparts of the net current signal, including:
  (i) a first digital current signal, the first digital current signal being a direct function of the net current measured by the current transducer when the grounding means is inactive;
  (ii) a second digital current signal, the second digital current signal being a direct function of the net current measured by the current transducer when the grounding means is active; and
  (iii) a third digital current signal, the third digital current signal being the difference between the first and second current signals and being indicative of the ground fault condition at a ground fault current of approximately 3 mA at any net current within the current range.

18. The apparatus of claim 17, wherein the means for producing digital counterparts of the net current signal includes a charge-balance circuit.

19. The apparatus of claim 18, wherein the charge-balance circuit comprises an integrating amplifier.

20. Apparatus for detecting a ground fault condition in a normally ungrounded supply system including conductors from a supply for supplying power to a load connected in the system, the apparatus comprising:
 (a) divider means for connecting a test impedance across the power supply, the test impedance having a tapping point;
 (b) grounding means for periodically connecting the tapping point to ground potential;
 (c) a current transducer for measurement of electrical current in one or more of the conductors at a location downstream of the divider means during operation of the system;
 (d) a detector circuit for signalling the ground fault condition, comprising:
  (i) a gain circuit for producing a first voltage signal, the first voltage signal being proportional to the electrical current measured by the current transducer;
  (ii) an integrator for producing an integrator signal, the integrator having a summing input that is maintained proximate a reference voltage;
  (iii) an oscillator for producing a variable frequency oscillator output, the frequency of the oscillator output being smoothly proportional to the integrator signal;
  (iv) a reference resistor connected between the gain circuit and the summing input for converting the first voltage signal to a current feeding the integrator;
  (v) a bridge circuit having a reference capacitor, an input terminal of the capacitor being connected between a pair of first and second switches, an output terminal of the capacitor being connected between a pair of third and fourth switches, the first and second switches being connected between the first reference voltage and a second reference voltage, the third and fourth switches being connected between the first reference voltage and the summing input; and
  (vi) a switch controller responsive to the oscillator for sequencing the bridge circuit among a first state wherein the capacitor is connected between the first and second reference voltages, a second state wherein the capacitor is connected between the summing input and the second reference voltage, a third state wherein the capacitor is connected between the summing input and the first reference voltage, and a fourth state wherein both sides of the capacitor are connected to the same potential, the frequency of the oscillator being a repeatable function of the net current sensed by the current transducer; and
 (e) means responsive to the oscillator for indicating the electrical current.

* * * * *